United States Patent
Lee et al.

(10) Patent No.: US 6,771,158 B2
(45) Date of Patent: Aug. 3, 2004

(54) MICRO ELECTROMECHANICAL DIFFERENTIAL ACTUATOR

(75) Inventors: Hsiao-Wen Lee, Hsinchu (TW); Wen-I Wu, Hsinchu (TW); Shih-Yi Wen, Taipei (TW); Wu-Cheng Kuo, Hsinchu (TW); Jui-Ping Weng, Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 10/307,367

(22) Filed: Dec. 2, 2002

(65) Prior Publication Data

US 2004/0027225 A1 Feb. 12, 2004

(30) Foreign Application Priority Data

Aug. 9, 2002 (TW) ........................................ 91117969 A

(51) Int. Cl.⁷ ............................. H01P 1/10; H01H 59/00
(52) U.S. Cl. .................. 337/36; 337/139; 337/141; 361/163; 60/529; 310/307
(58) Field of Search ............................. 337/12, 36, 14, 337/16, 123, 139–141, 339, 343, 298, 393; 60/527–529; 310/306–309; 361/163

(56) References Cited

U.S. PATENT DOCUMENTS

| | | | | |
|---|---|---|---|---|
| 5,726,480 A | * | 3/1998 | Pister | 257/415 |
| 5,870,518 A | * | 2/1999 | Haake et al. | 385/90 |
| 6,275,325 B1 | * | 8/2001 | Sinclair | 359/291 |
| 6,438,954 B1 | * | 8/2002 | Goetz et al. | 60/527 |
| 6,483,419 B1 | * | 11/2002 | Weaver et al. | 337/393 |
| 6,531,947 B1 | * | 3/2003 | Weaver et al. | 337/139 |

OTHER PUBLICATIONS

"The realization and design considerations of a flip–chip integrated MEMS tunable capacitor" by Harsh et al., Sensors and Actuators 80 (2000) 108–118.*

* cited by examiner

Primary Examiner—Anatoly Vortman
(74) Attorney, Agent, or Firm—Birch, Stewart, Kolasch & Birch, LLP

(57) ABSTRACT

A micro electromechanical differential actuator is comprised of a suspension arm structure and/or a bridge structure to make a two-degree-of-freedom and bi-directional motion. The actuator support base can make out-of-plane or in-plane vertical and horizontal motions. The invention is applicable in optical micro electromechanical devices such as optical switches, variable optical attenuators, optical tunable filters, modulators, tunable VCSEL's, grating modulators, micro displays, and RF switches.

11 Claims, 20 Drawing Sheets

MICRO ELECTROMECHANICAL DIFFERENTIAL ACTUATOR

BACKGROUND OF THE INVENTION

1. Field of Invention

The invention relates to a micro electromechanical differential actuator used in micro electromechanical systems (MEMS) such as optical switches, variable optical attenuators, optical tunable filters, modulators, tunable VCSEL's, grating modulators, micro displays, optical information and RF switches. In particular, the invention pertains to a micro electromechanical differential actuator that has low optical/RF loss and micro mirror stabilization operation.

2. Related Art

Optical actuators made using the micro electromechanical system (MEMS) technology can be applied to optical switches, variable optical attenuators, optical tunable filters, modulators, tunable VCSEL's, grating modulators, and RF switches. In these devices, how to manufacture a low optical loss mirror and how to make no-tilt-angle parallel motion stabilization operations are the key techniques of great importance.

With reference to FIG. 1A, in the conventional RF switch technique, the film layer 11 (upper electrode) is at its upper position when it is in the OFF state. When the RF switch is in the ON state, the film layer 11 is dragged by an electrostatic force to touch the lower dielectric material layer 12 (the lower electrode layer 13) to achieve the RF switch action. The disadvantage of this type of switches is the structural deformation shown in FIG. 1B. This results in the effect that the contact area grows during the transient state from a point to an area. The contact force during the area growth also varies, as shown in FIG. 1C. This is the well-known problem of "contact area reliability" in RF switches. One therefore sees how important it is to develop a planar actuator that makes parallel motions to conquer the reliability problem.

As shown in FIGS. 2A and 2B, a micro optical electromechanical tunable VCSEL of prior art (Bandwidth 9) has a distributed Bragg reflector (DBR) mirror, which utilizes a micro electromechanical suspension arm 15. The upper layer material of the suspension arm 15 is GaAs 151 with a larger coefficient of thermal expansion. The lower layer material of the suspension arm is a DBR layer 152, 153 with a smaller coefficient of thermal expansion. During the operation, the p-DBR layer 153 uses an electrostatic force to attract the n-DBR layer 152, producing a downward motion to modulate the outer cavity wavelength. However, when the electrostatic field is imposed, the mode limitation of the suspension structure produces a tilt angle at the terminal of the suspension arm. Thus, the n-DBR layer 152 can not be maintained horizontal. The net effect is to produce a laser beam with shifted and asymmetric beam profile outputs, increasing the coupled optical loss in optic fibers.

As shown in FIG. 3, the micro optical electromechanical modulator of prior art (Lucent) uses an in-plane center-symmetric four-string structure 17 to achieve the vertical parallel motions of the support mirror. However, due to the close rigidities of the support mirror as well as the suspension arm and the property of the structural influence line, a deformation curve similar to those in FIGS. 1B and 1C will occur. This reduces the optical clear aperture and, therefore, the center-symmetric support mirror deforms in response to the strain to produce a larger optical loss.

With reference to FIGS. 4A and 4B, the conventional micro optical electromechanical grating modulator of prior art (Silicon Light Machine) is fixed by its two ends onto a symmetric bridge structure in the middle of a substrate 16 for the support mirror to make vertical parallel motions. However, due to the close rigidities of the support mirror and the suspension arm as well as the property of the single-layer structural influence line, a deformation curve similar to those in FIGS. 1B and 1C will occur, too. The center-symmetric support mirror deforms in response to the strain and produces a larger optical loss. The grating modulator performs an out-of-plane action, only modulating the diffraction order efficiency. Nevertheless, if one can design an in-plane motion, then the diffraction light can be modulated to achieve the function of in-plane phase shifting, the application including (polarization mode dispersion) PMD compensator and micro interferometer.

The drawback of using the surface micromachining technology to prepare an optical switch with the micro mirror actuator structure is that the mirror thickness is limited between 2 $\mu$m and 5 $\mu$m with a diameter between 350 $\mu$m and 500 $\mu$m during the machining process possess with good optical performances. In these conditions, the micro mirror is likely to experience opto-thermal deformation, resulting in a greater optical loss. This is not acceptable for optical communications. Therefore, it is important to design a silicon wafer mirror as a mirror optical switch with a high-quality optical surface and high rigidity so that good optical properties can be maintained in long-term operations.

In view of the foregoing, it is highly desirable to design a micro electromechanical actuator with two degrees of freedom of parallel motion as well as extremely low mirror deformation and optical loss. Such actuators can be applied to such devices as optical switches, variable optical attenuators, optical tunable filters, modulators, tunable VCSEL's, grating modulators, and RF switches. The ultimate goal is to achieve low loss and stable operations.

SUMMARY OF THE INVENTION

The invention provides a micro electromechanical differential actuator, which can make no-tilt-angle motions with two degrees of freedom. That is, the differential actuator is able to make in-plane and out-of-plane vertical and horizontal parallel motions. In addition, the differential actuator design can compensate tilt error or vice versa.

The disclosed micro electromechanical differential actuator uses a single-sided suspension arm set differential design or double-sided bridge suspension arm set differential design. The structural rigidity of the suspension arm set is smaller than that of the support part. The suspension arm set consists of upper, lower, left and right suspension arms, so that the differential suspension arm set absorbs the rotation change when being driven by an external force. Therefore, the support part does not tilt and makes out-of-plane vertical motions and/or in-plane horizontal motions due to its symmetry.

The driving methods of the invention include the electrostatic force, Joule thermal force, electromagnetic actuation, piezoelectric force or other equivalent means.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

The disclosed micro electromechanical differential actuator can be applied to optical switches, variable optical attenuators, optical tunable filters, modulators, tunable VCSEL's, grating modulators, and RF switches. In optical switches, the silicon crystal on the silicon wafer is used as the optical mirror. Along with an in-plane side actuator, the optical mirror is an optical switch for reflecting or passing a light beam. Alternatively, dry and wet etching techniques can be used to make a mirror on the silicon wafer. In this case, an out-of-plane actuator should be used. When applying the above structure to tunable surface emitting lasers, the out-of-plane parallel motion structure can be used to adjust the wavelength of the laser beam. When applied to optical tunable filters, the out-of-plane motion structure can be used to adjust the Fabry-Perot cavity distance, thereby modulating the optical spectrum. When applied to grating modulators, both the in-plane and out-of-plane motion structures can be simultaneously used to modulate the amplitude and phase of the incident light.

Figure 1A:
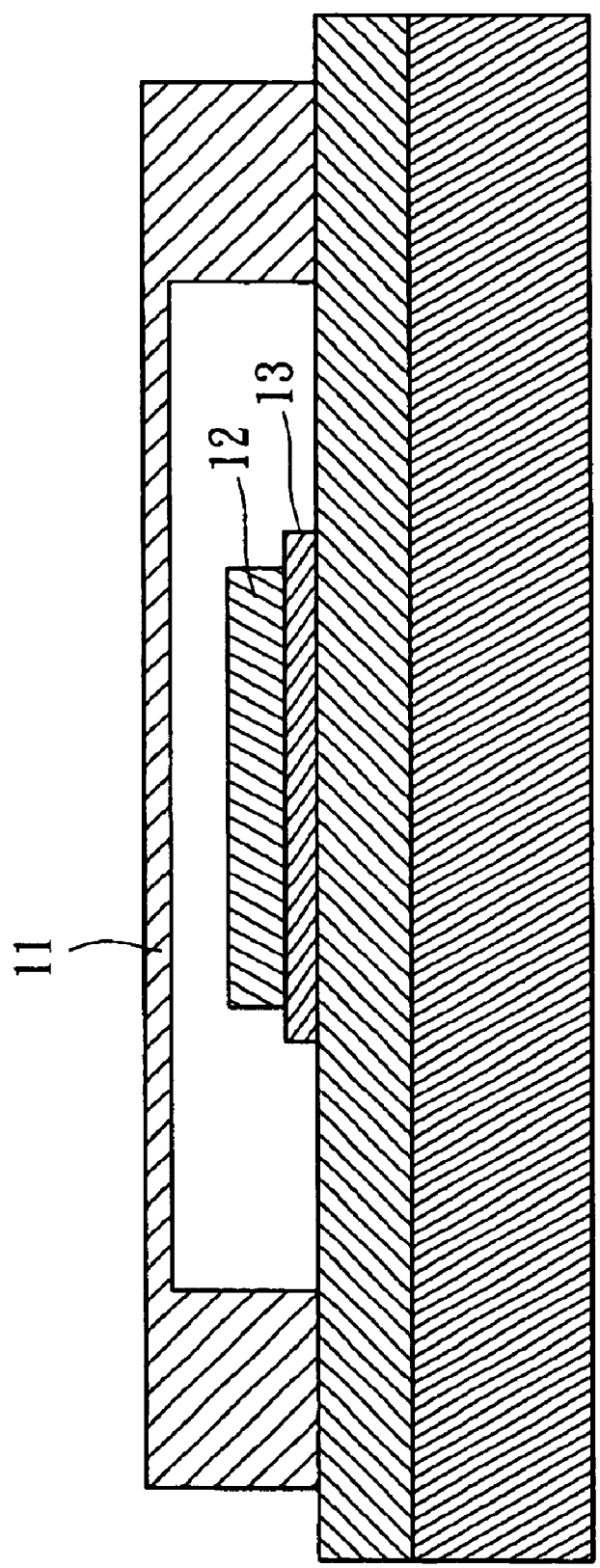
FIGS. 1A to 1C are schematic views of a conventional RF switch.
Figure 1B:
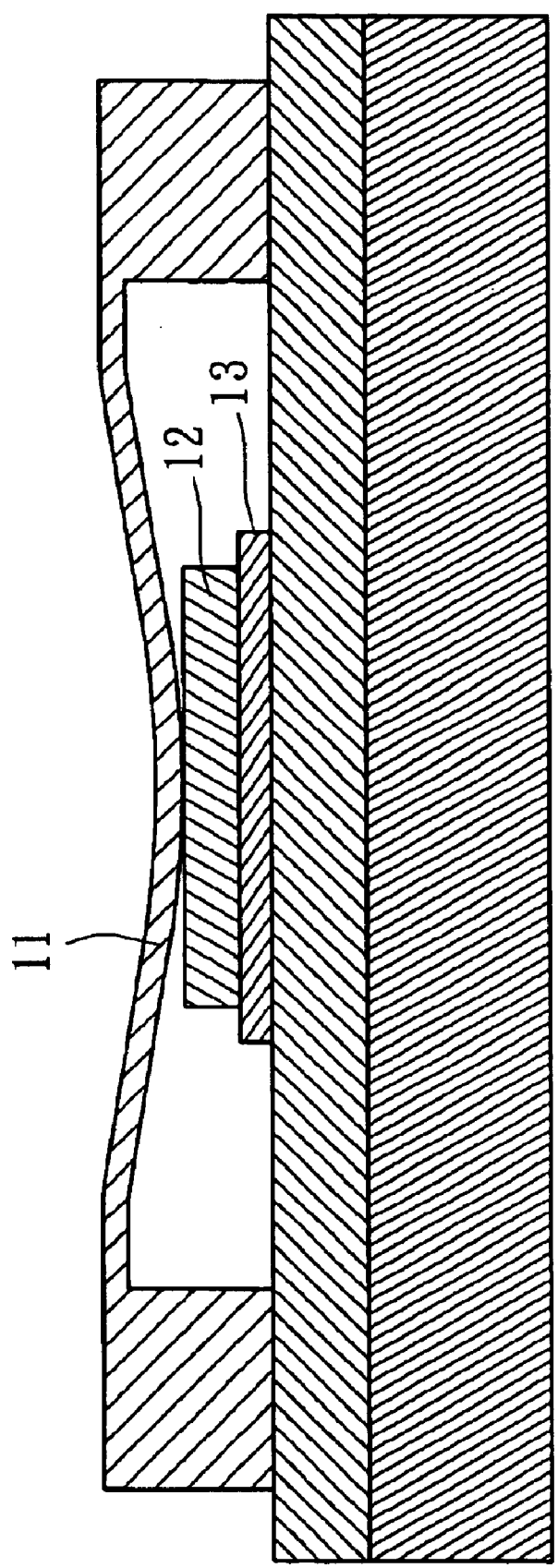
Figure 1C:
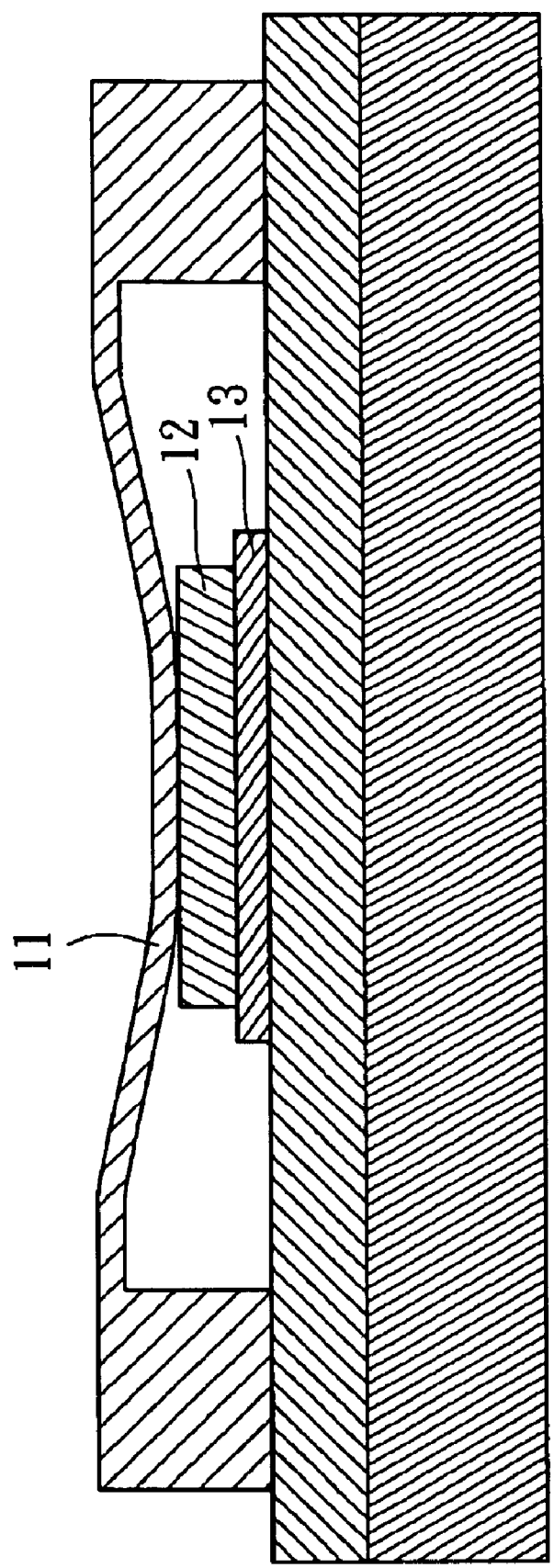
Figure 2A:
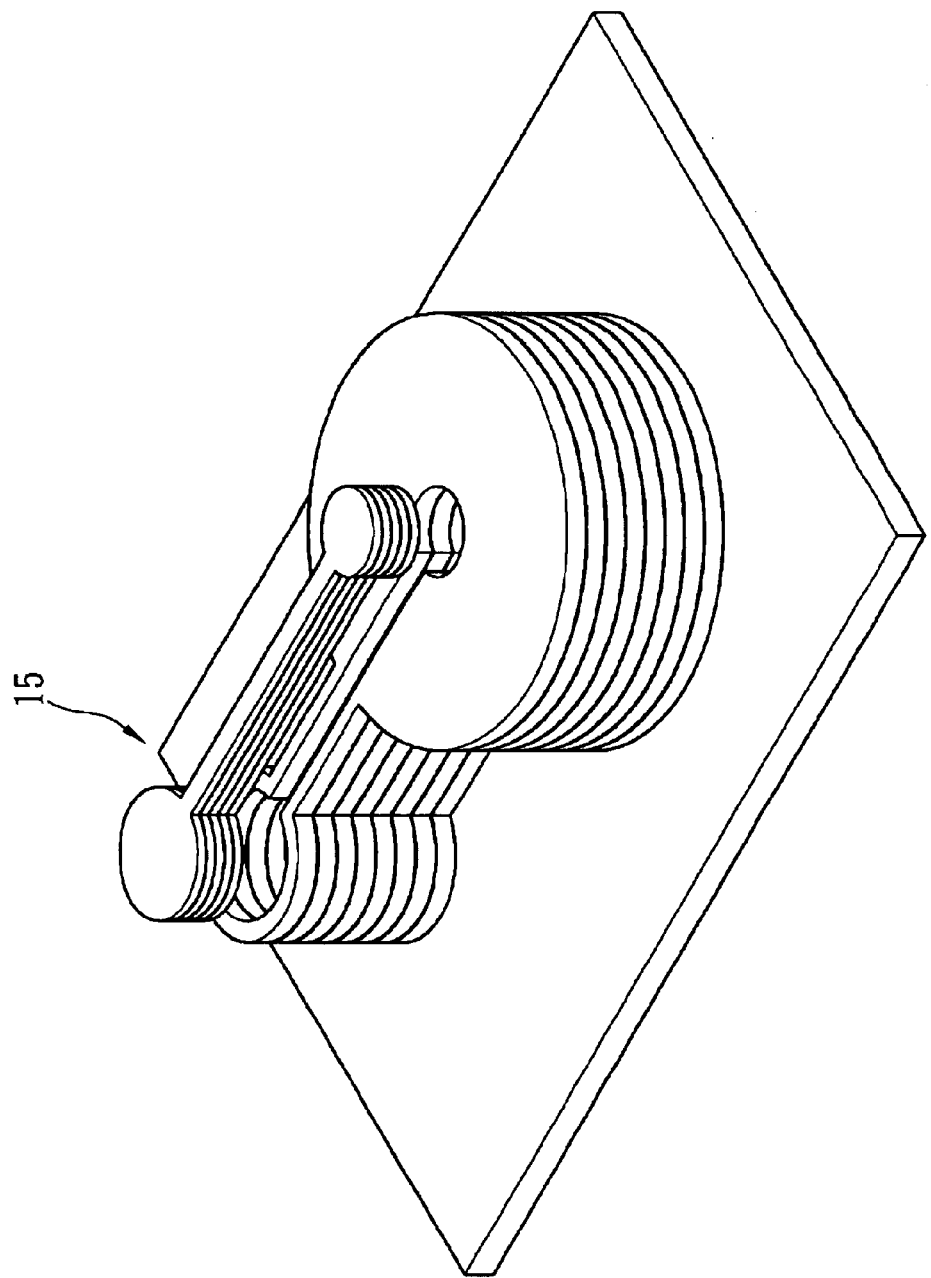
FIGS. 2A and 2B is a schematic view showing how a micro optical electromechanical VCSEL uses the micro electromechanical suspension arm.
Figure 2B:
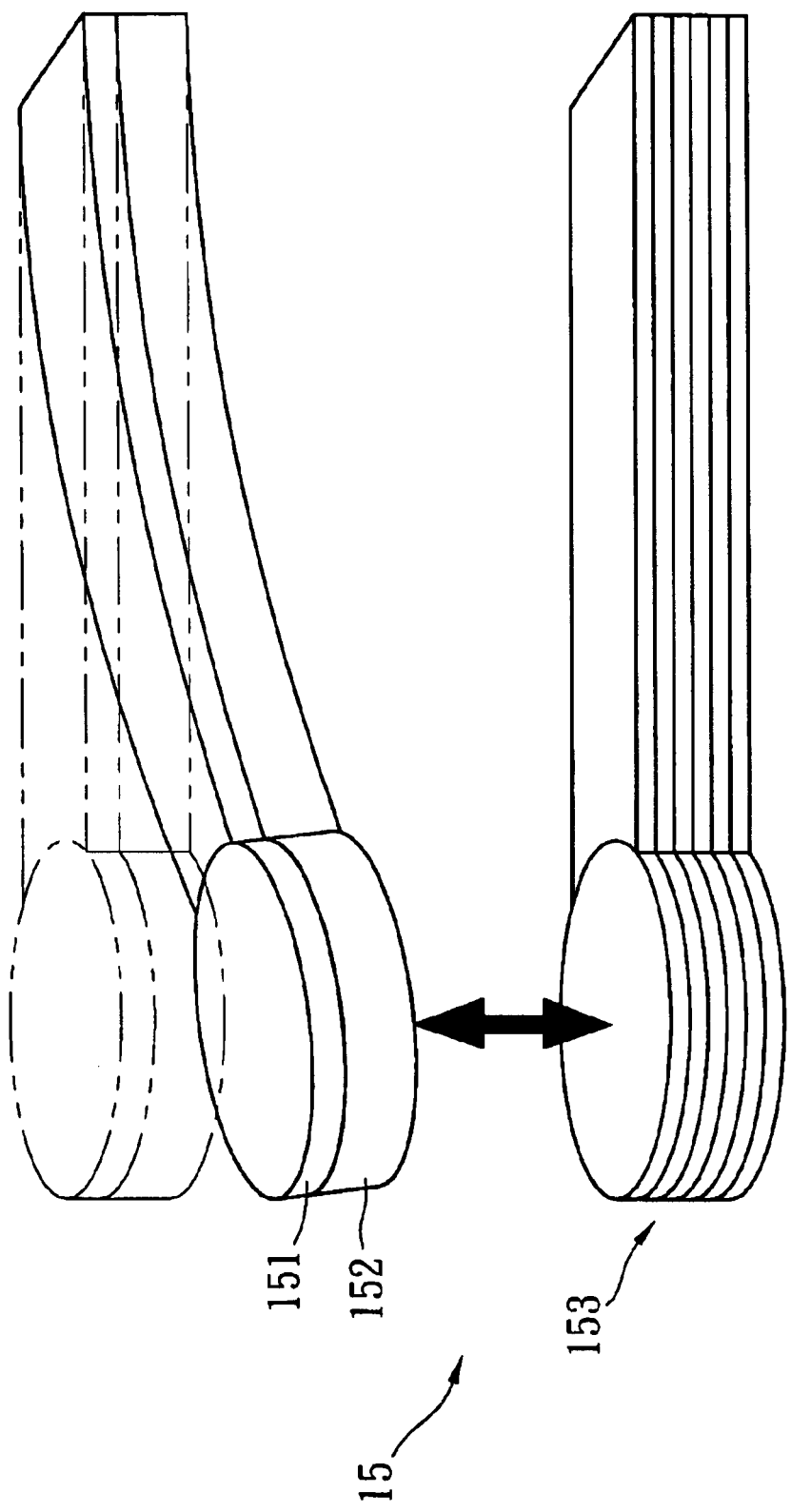
Figure 3:
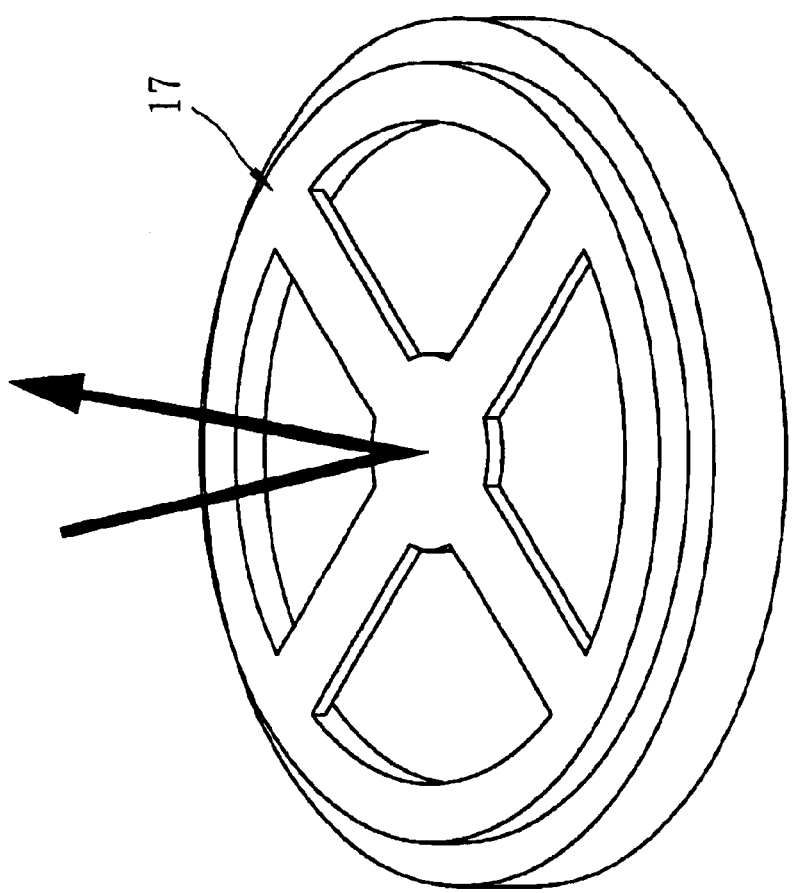
FIG. 3 is a schematic view of a conventional micro optical electromechanical modulator.
Figure 4A:
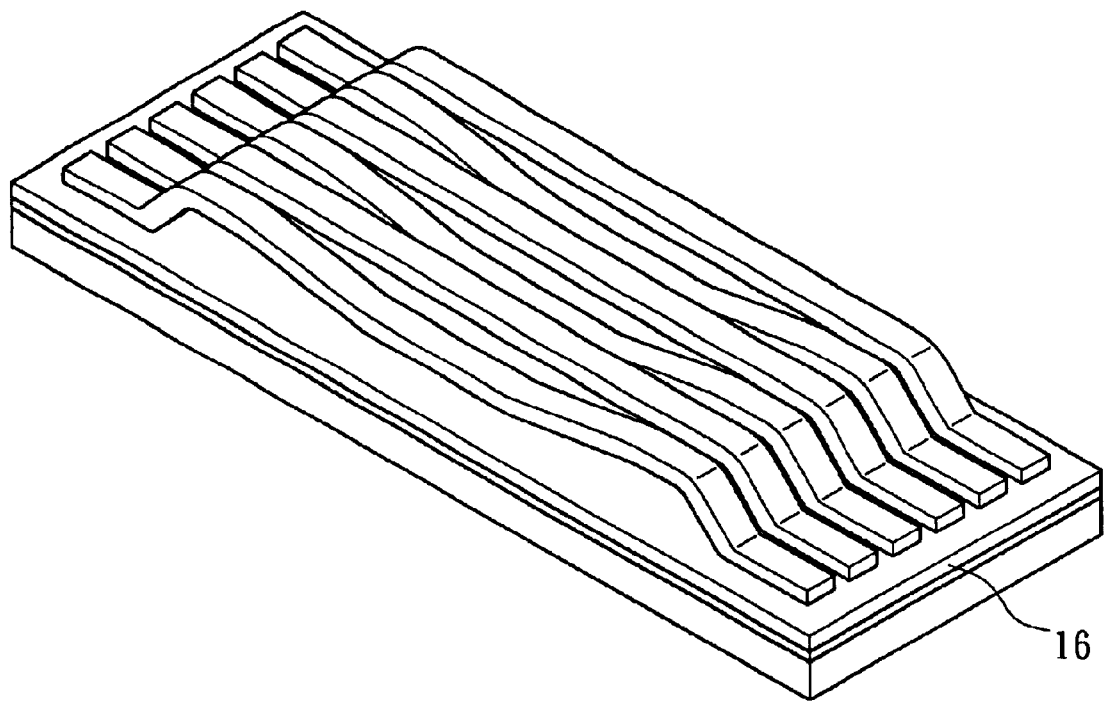
FIGS. 4A and 4B are schematic views of a conventional micro optical electromechanical grating modulator.
Figure 4B:
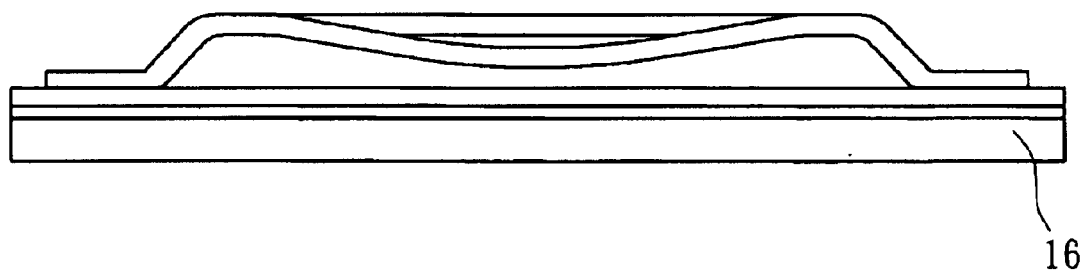
Figure 5:
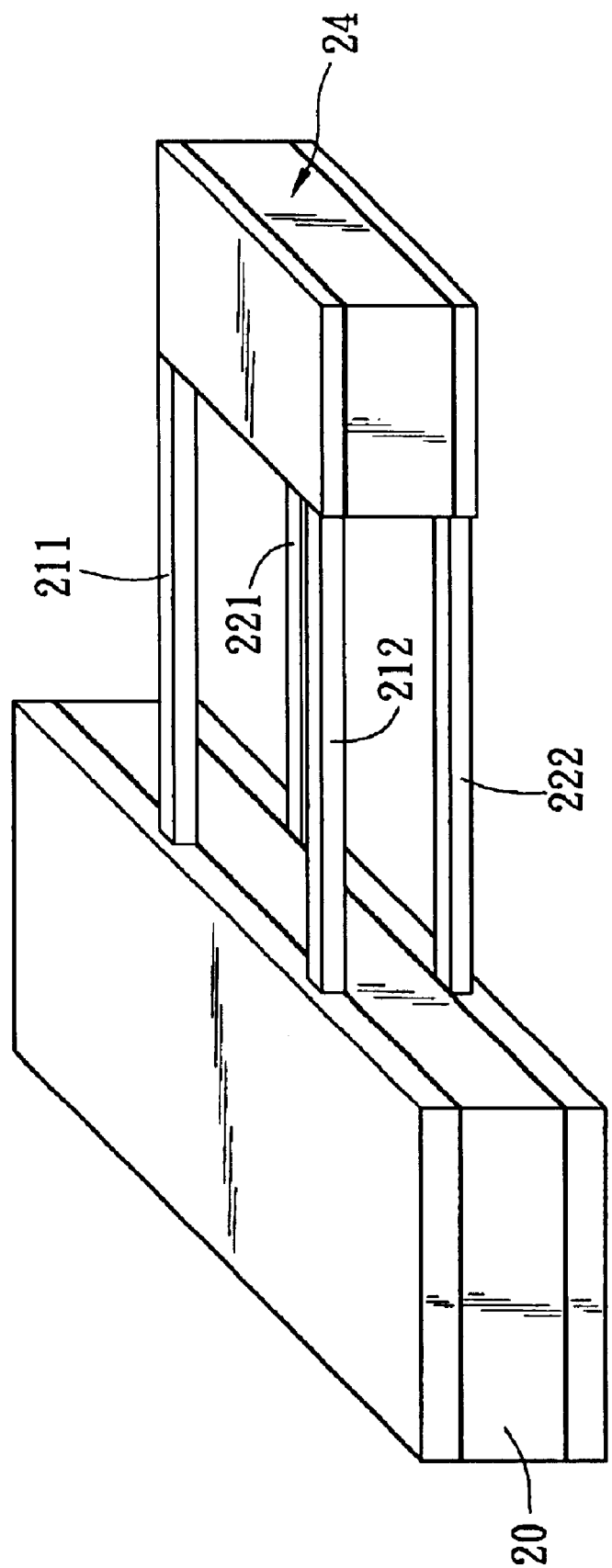
FIG. 5 is a schematic view of the disclosed single-sided suspension arm.

FIG. 5 shows a single-sided suspension arm differential actuator of the invention. A suspension arm structure with four suspension arms is employed to achieve out-of-plane and in-plane motions with the characteristic of no tilt angle. The disclosed single-sided suspension arm differential actuator contains a fixed end 20, a suspension arm set with four suspension arms 211, 212, 221, 222 and a support port 24. The fixed end 20 and the support part 24 are connected using the suspension arm set. To have a larger rigidity ratio between the support part and the suspension arm set, we can either have a thicker support part or utilize the difference in their Young's modulus. The driving methods include the electrostatic force, Joule thermal force, electromagnetic actuation, and piezoelectric force. The property of the suspension arm set differential structure and the rigidity difference design for the support mirror and the suspension arm set structure render parallel motions without tilting. The deformation energy is mostly absorbed by the suspension arm set so that the support part has very little deformation. In a one-degree-of-freedom motion design, one can use a single-degree-of-freedom differential suspension arm set composed of only two suspension arms. In practice, to have a larger rigidity ratio between the support part and the suspension arm set one can use the universal four suspension arm structure. For motions with two degrees of freedom, we use the double-degree-of-freedom differential suspension arm set composed of four suspension arms.

Figure 6:
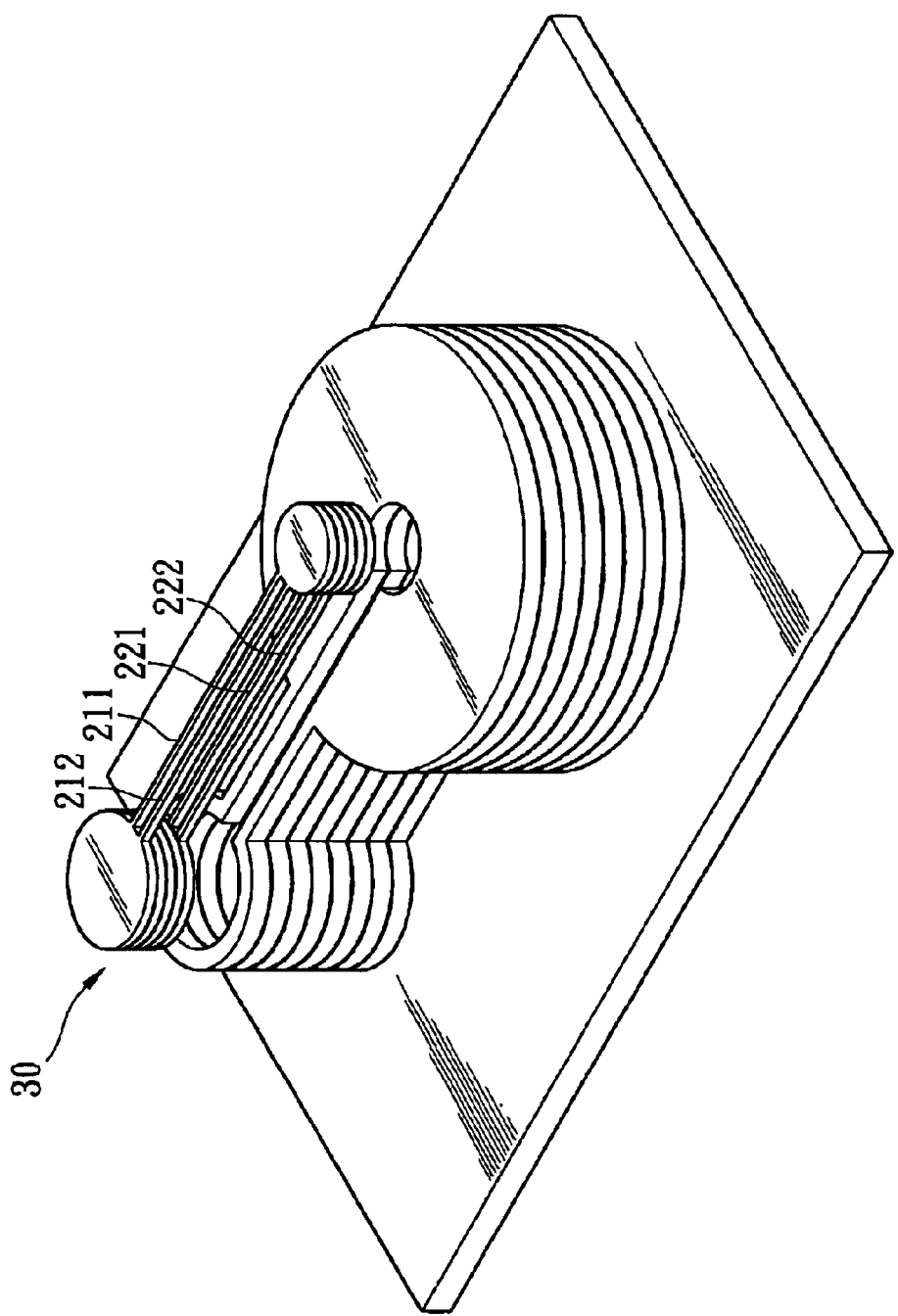
FIG. 6 is a schematic view of using the invention in a tunable laser.
Figure 7A:
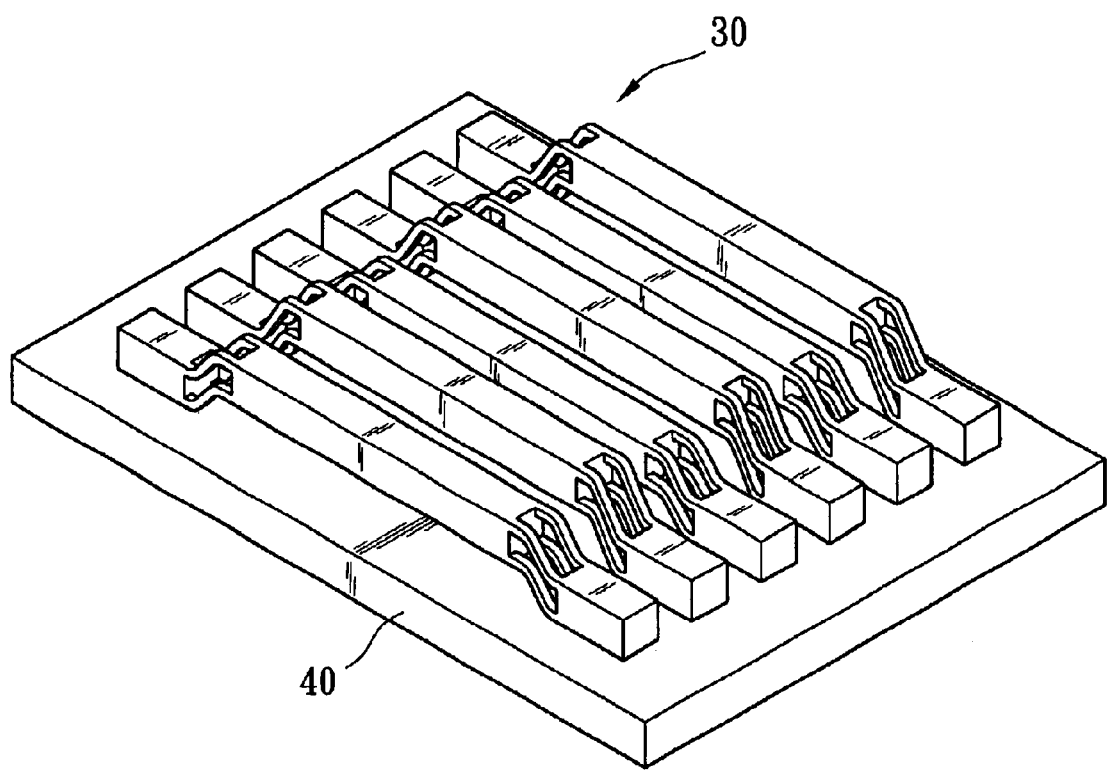
FIGS. 7A and 7B are schematic views of the disclosed two-sided bridge array differential actuator.
Figure 7B:
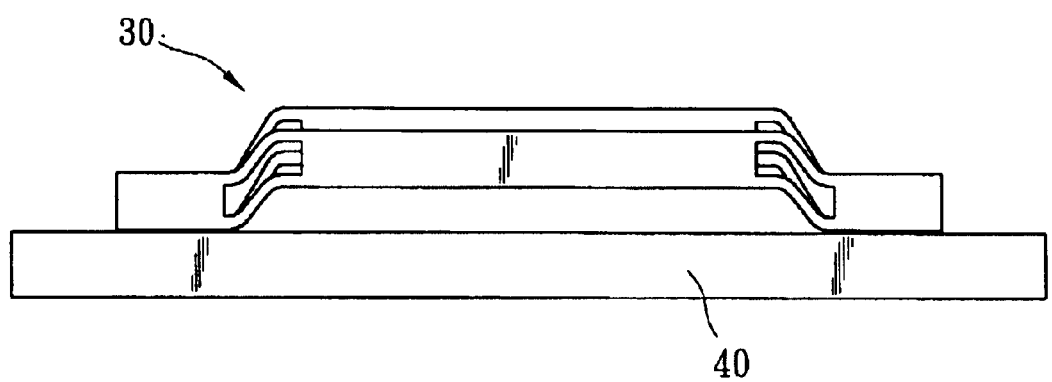
Figure 8:
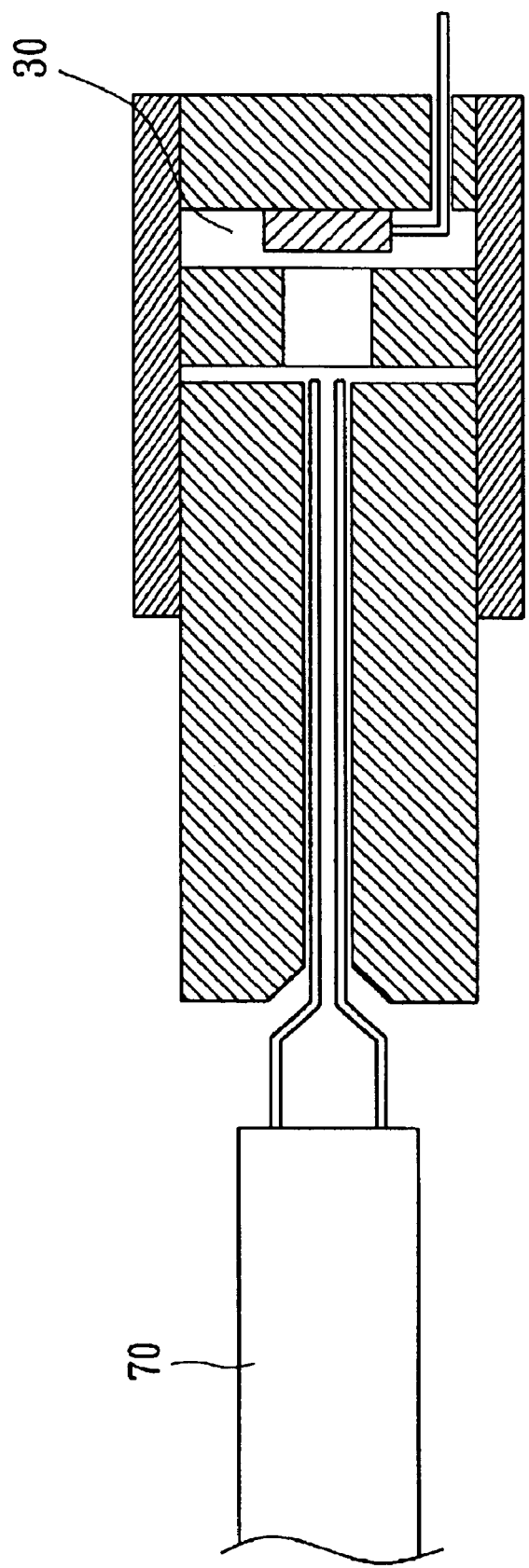
FIG. 8 shows an attenuator example of the invention coupled with a dual core fiber.
Figure 9:
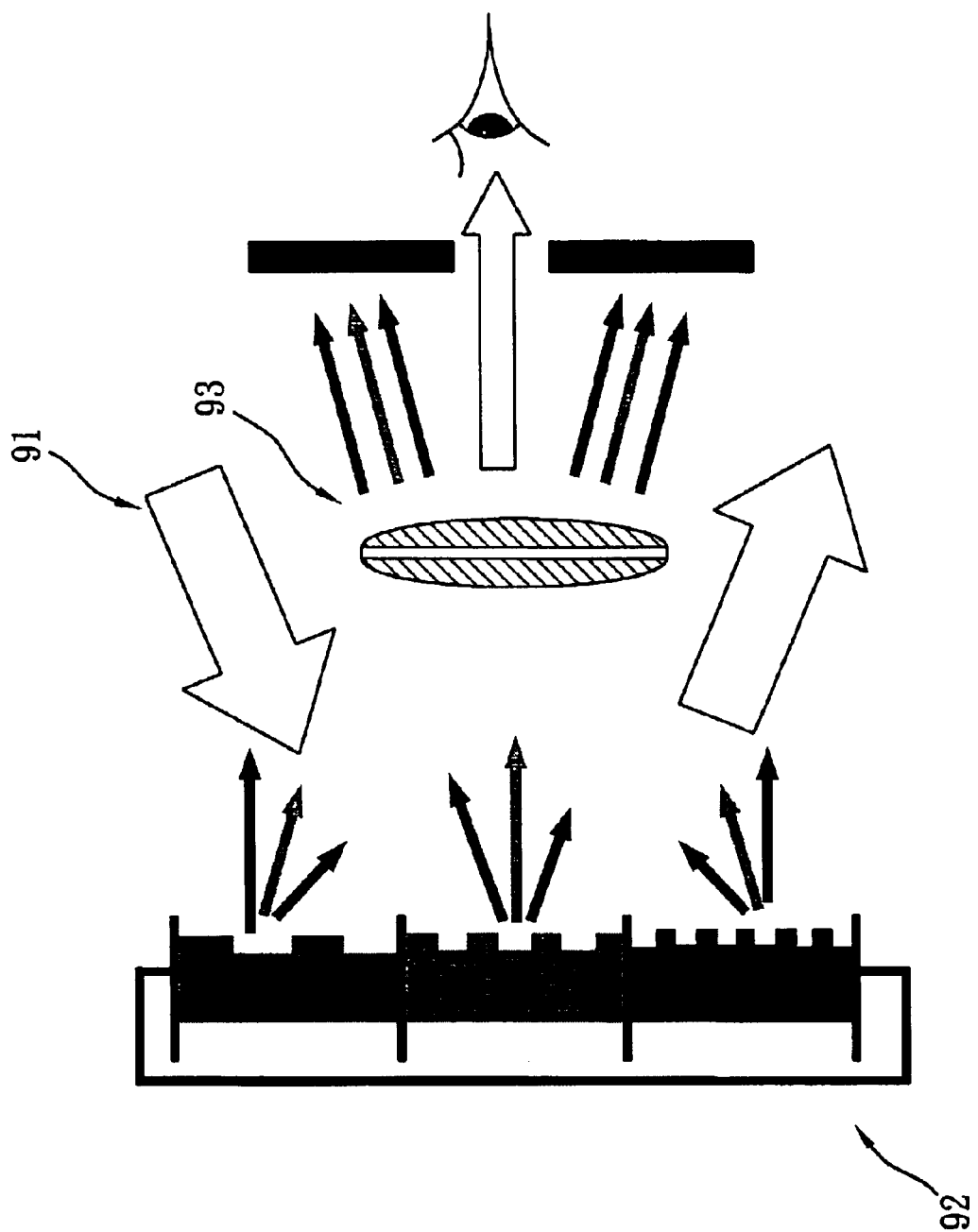
FIG. 9 shows an example of applying the invention in a micro display.

When using an array differential actuator 30 in a tunable laser (see FIG. 6), the DBR mirror at one end has the no-tilt-angle property so that the output beam is symmetric and has less optical loss. Alternatively, the other side of the support part 24 is installed with a suspension arm to form a double-sided bridge array differential actuator 30. The actuator 30 is connected to a substrate 40. The double-sided suspension arm set supports the Fabry-Perot filter on the central mirror to perform in-plane and out-of-plane parallel motions with low optical loss and no tilting. One can also make an array of the double-sided bridge differential actuators, as shown in FIGS. 7A and 7B, to form an array differential actuator. Such an actuator can modulate the diffraction order efficiency and phase through the in-plane and out-of-plane degrees of freedom. Besides, the double-sided bridge array differential actuator can be used to couple with a dual core fiber 70. As shown in FIG. 8, adjusting the in-plane motion can achieve the goal of modulating the diffraction order efficiency for a variable optical attenuator. Moreover, combining a light source 91, an array differential actuator 92, and an imaging system 93 can achieve the function of a micro display, as shown in FIG. 9.

Figure 10A:
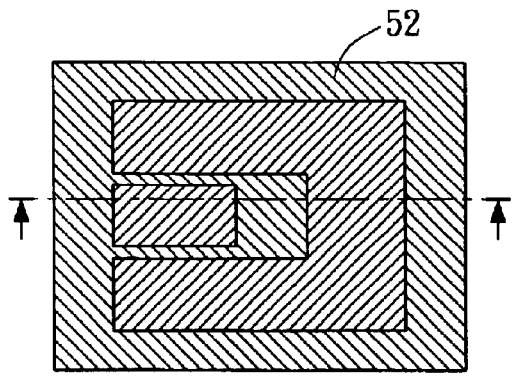
FIGS. 10A, 10C, 10E, 10G, 10I, 10K, and 10M are top views of the disclosed LIGA-like manufacturing procedure.
Figure 10B:
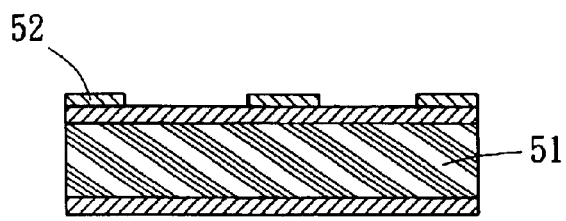
FIGS. 10B, 10D, 10F, 10H, 10J, 10L, and 10N are side views of the disclosed LIGA-like manufacturing procedure.
Figure 10C:
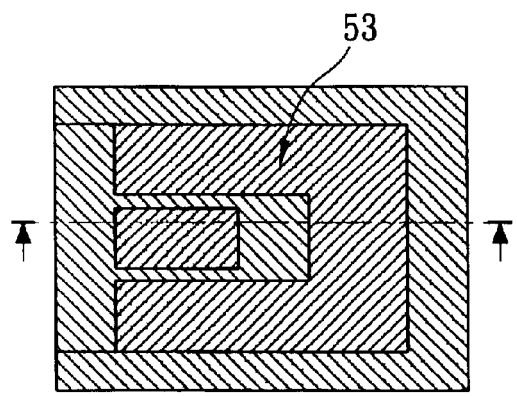
Figure 10D:
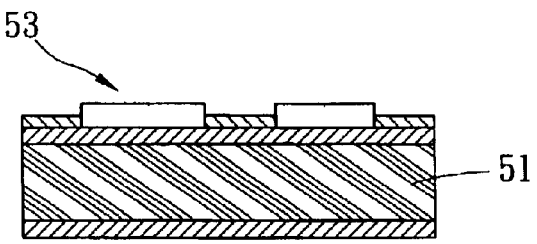
Figure 10E:
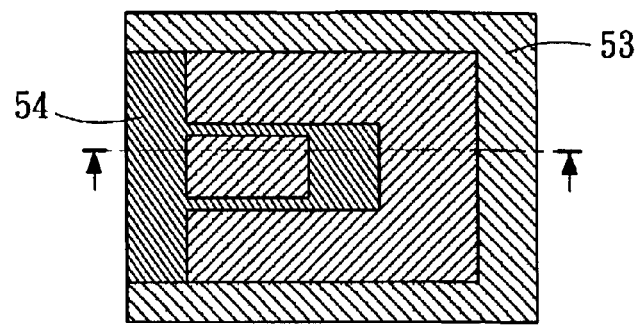
Figure 10F:
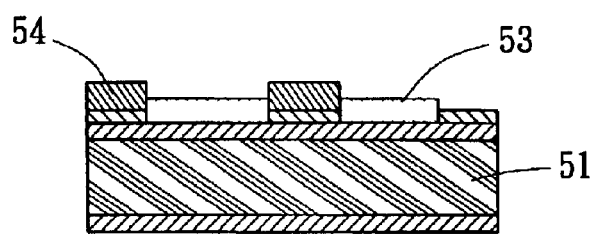
Figure 10G:
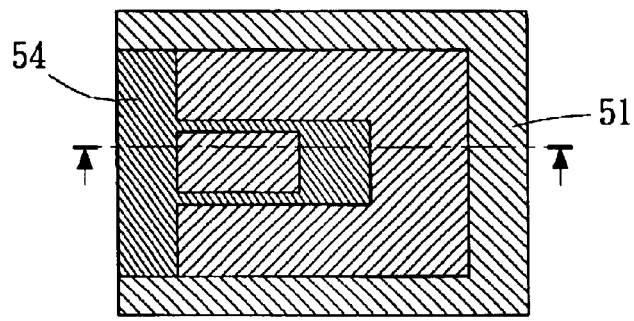
Figure 10H:
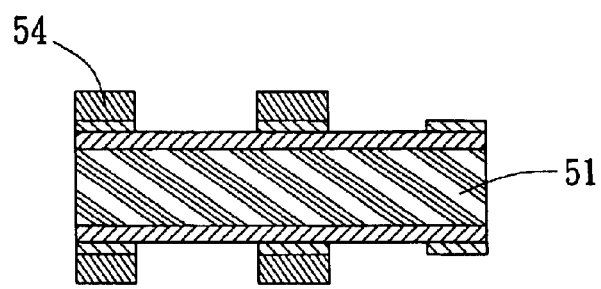
Figure 10I:
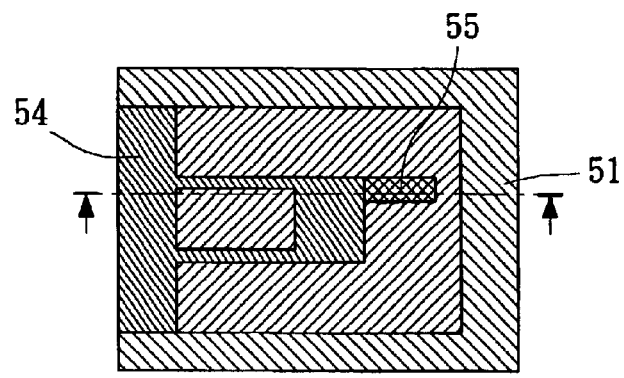
Figure 10J:
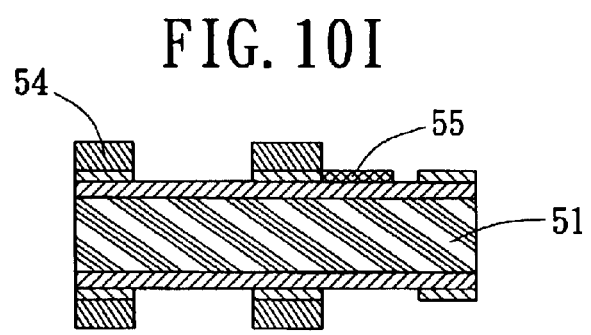
Figure 10K:
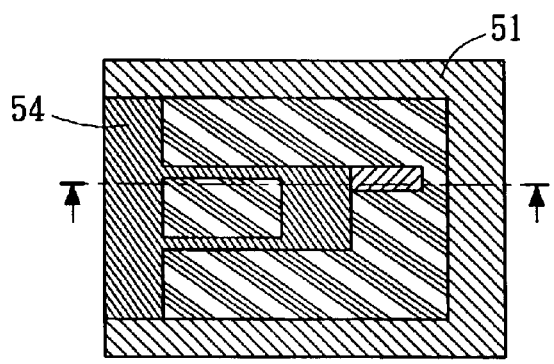
Figure 10L:
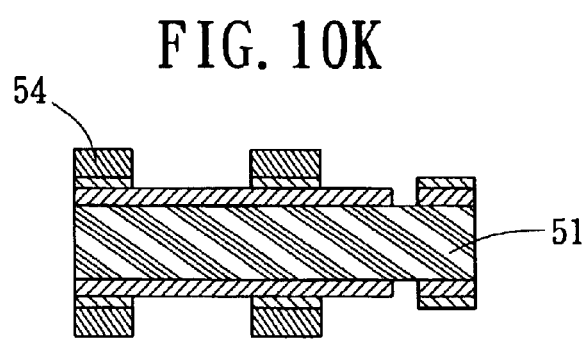
Figure 10M:
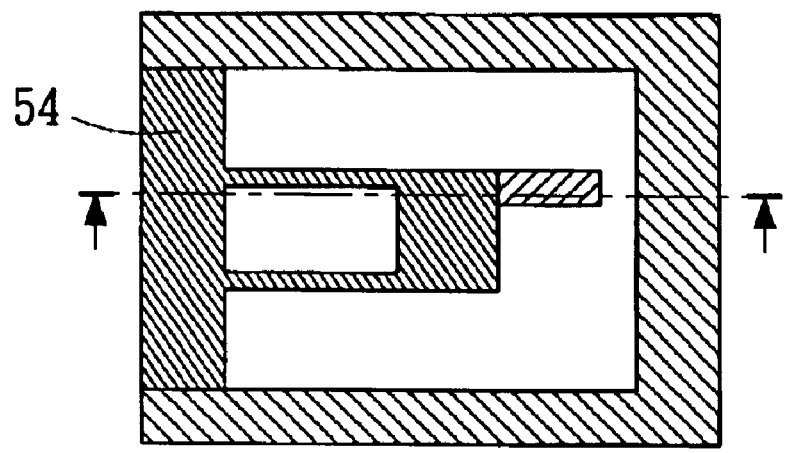
Figure 10N:
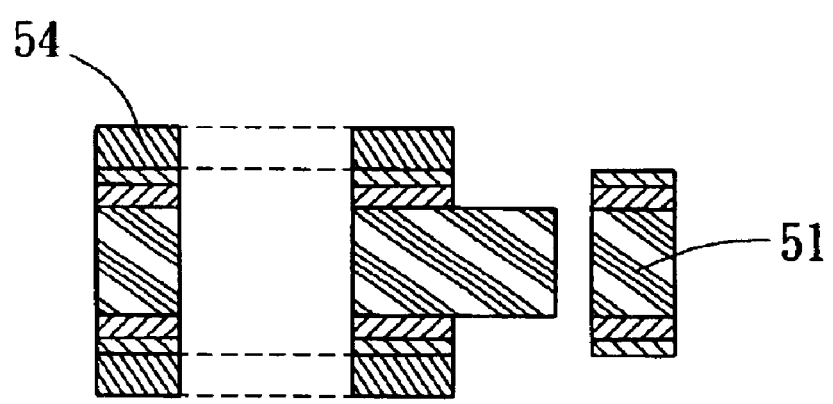

The manufacturing procedure adopts the surface micromachining or LIGA-like micro electromechanical technology. (LIGA is the abbreviation of lithographic, galvanoformung, and abformungg in German with the following means: lithographic=lithography, galvanoformung=electroplating forming, and abformung=mold forming.) Take the LIGA-like micro electromechanical manufacturing process and the single-sided differential actuator structure as an example embodiment. One surface of a silicon substrate 51 is plated with a conductive layer 52 using the lift-off technique (FIGS. 10A and 10B). A lithography PR procedure then defines the negative pattern of a structure area 53 (FIGS. 10C and 10D), followed by coating or plating a structure area material 54 (FIGS. 10E and 10F). The above mentioned three-step procedure is repeated to make a differential structure symmetric about the wafer (FIGS. 10G and 10H). Afterwards, the lithography procedure is employed to define the pattern of a micro support mirror 55 (FIGS. 10I and 10J). The mask structure of a nitride film and the micro support mirror pattern are then defined by reactive ion etching (RIE) (FIGS. 10K and 10L). Finally, a wet etching or dry etching procedure is used to release the structure and the micro support mirror pattern 55 (FIGS. 10M and 10N).

Figure 11A:
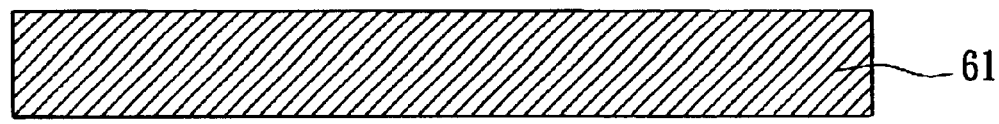
FIGS. 11A to 11F are schematic view of the disclosed surface micromachining.
Figure 11B:
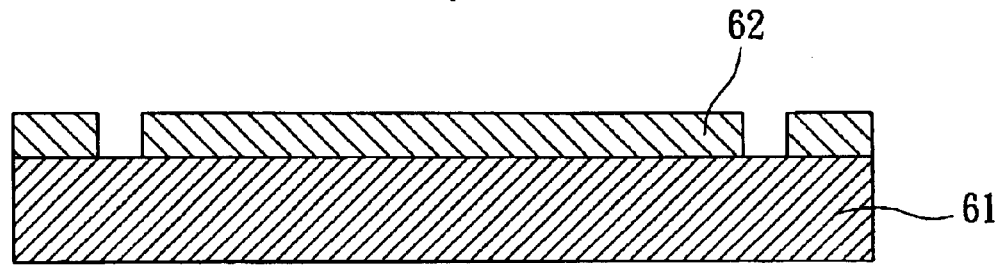
Figure 11C:
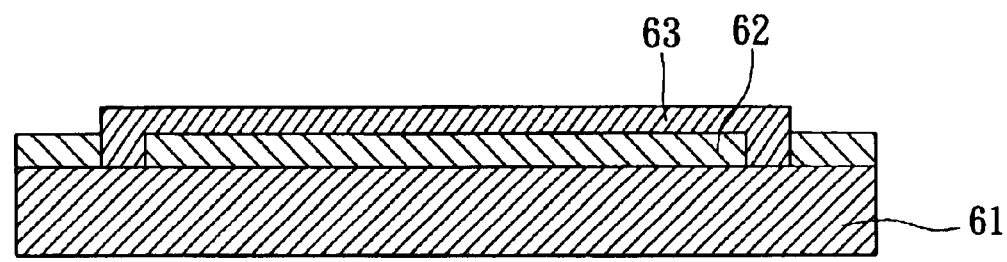
Figure 11D:
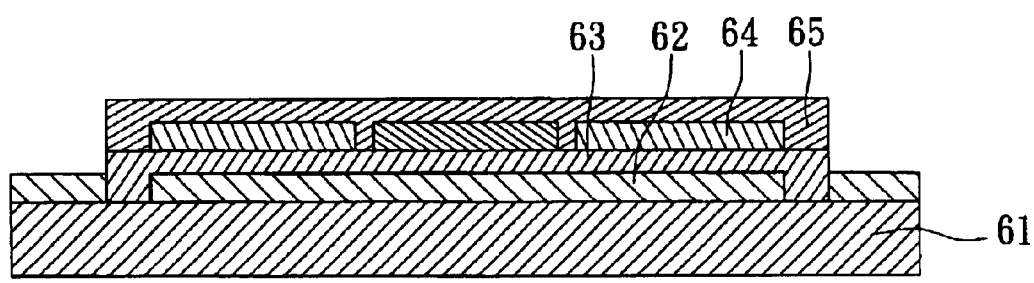
Figure 11E:
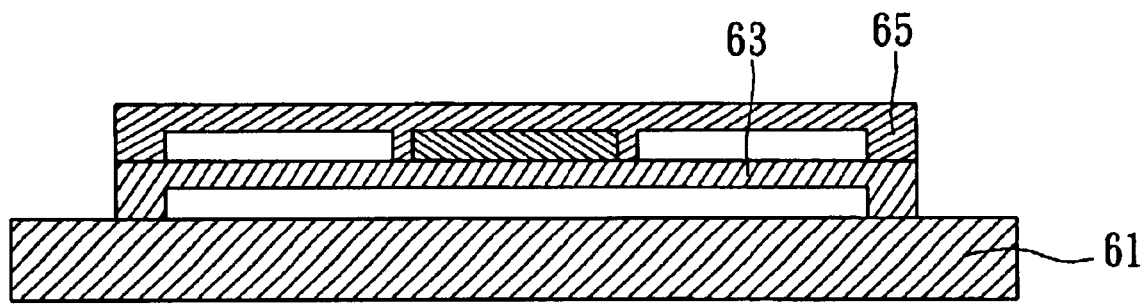
Figure 11F:
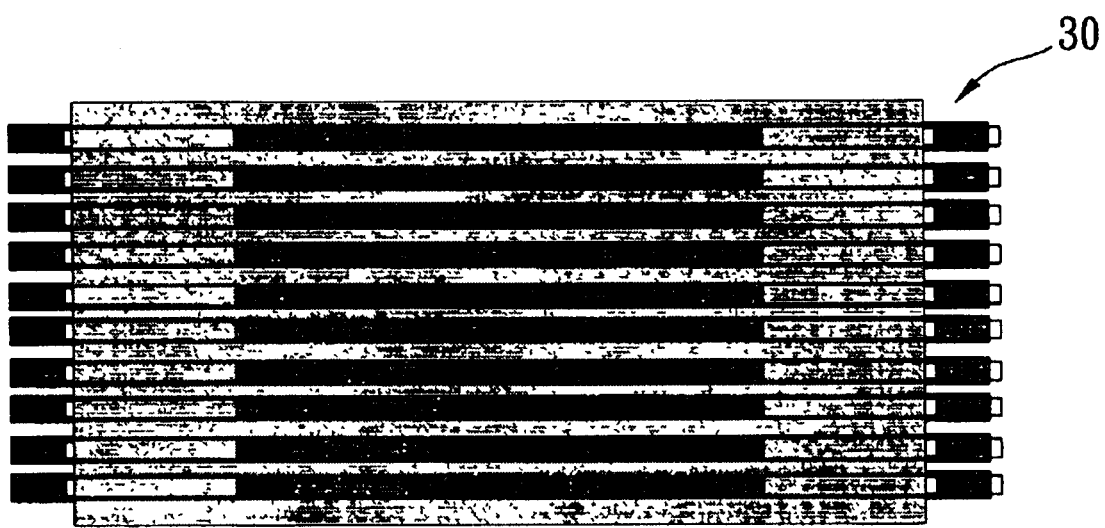

We further use the surface micromachining micro electromechanical procedure and the bridge differential actuator structure to explain the invention. With reference to FIGS. 11A and 11B, one surface of a silicon substrate 61 is deposited with silicon oxide using the thin-film deposition technology to form a first sacrifice layer 62. A first sacrifice layer pattern, a first structure layer 63 of the differential actuator, and a post connection part of the substrate are formed by the RIE along with photo mask etching. Afterwards, the thin-film deposition technology is used to deposit a polysilicon layer as the first structure layer 63. A second sacrifice layer 64 of the differential actuator and the post connection part of the first structure layer 63 are formed by RIE and photo mask etching (see FIG. 11C). The above actions are repeated to form the second structure layer 65 of the differential actuator (FIG. 11D). The support mirror in this embodiment is a layered structure formed by sandwiching the second sacrifice layer 64 between the first and second polysilicon layers, providing a desired rigidity. Finally, we perform structure releasing. FIG. 11E shows a side view of the array differential actuator, and FIG. 11F shows its top view.

The manufacturing procedures described above are only examples for illustrating the spirit of the invention. Any expert in the field can easily use various procedures such as surface micromachining, volume micromachining, CMOS and LIGA-like procedures to integrate the actuator. Along with an appropriate photo mask, one can make single-sided and double-sided bridge structures. With different size parameters and materials, it is possible to manufacture optical switches, variable optical attenuators, optical tunable filters, modulators, tunable VCSEL's, grating modulators, micro displays and RF switches.

Figure 12A:
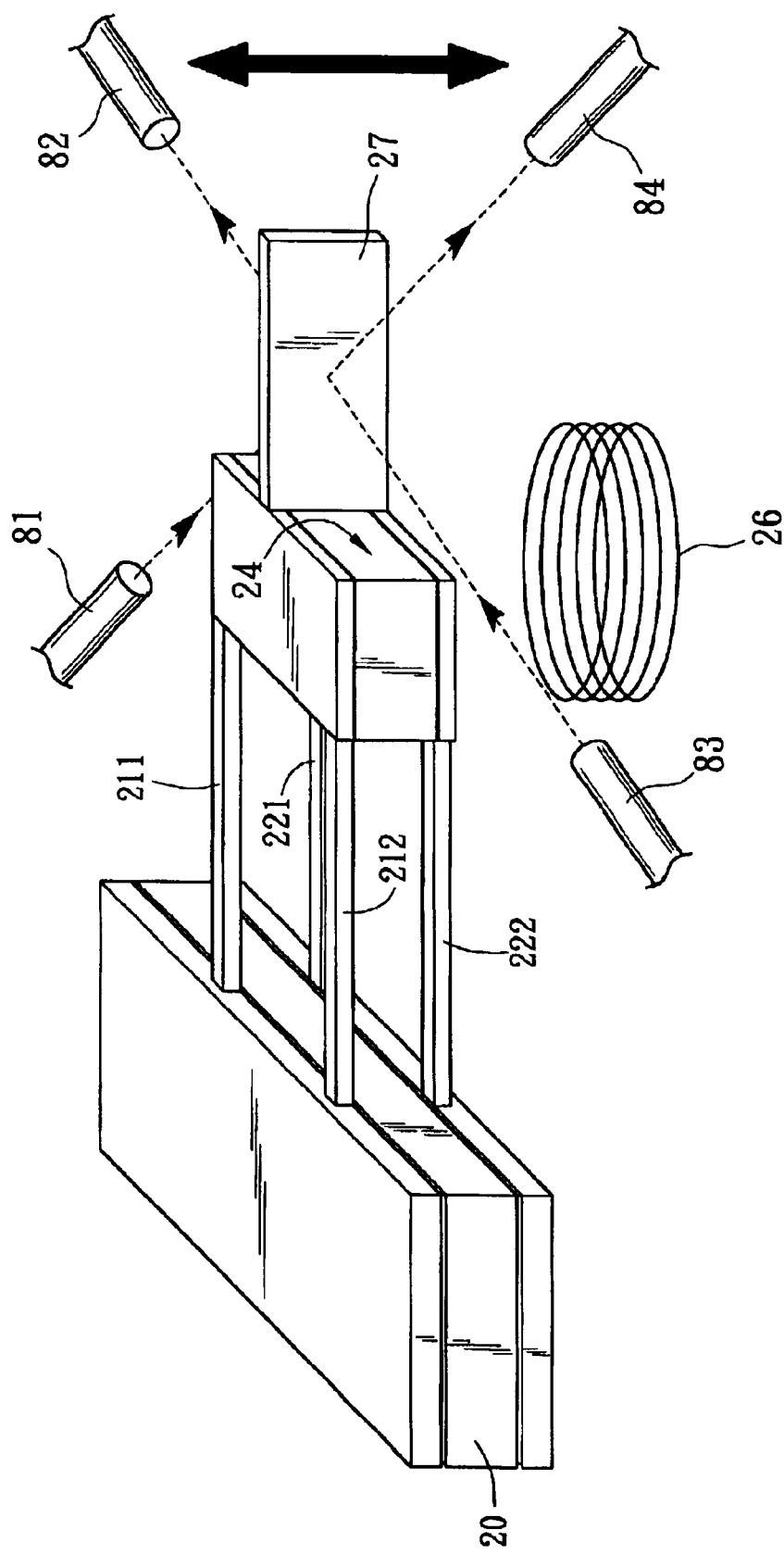
FIGS. 12A and 12B show the embodiment of using the invention in an optical switch.
Figure 12B:
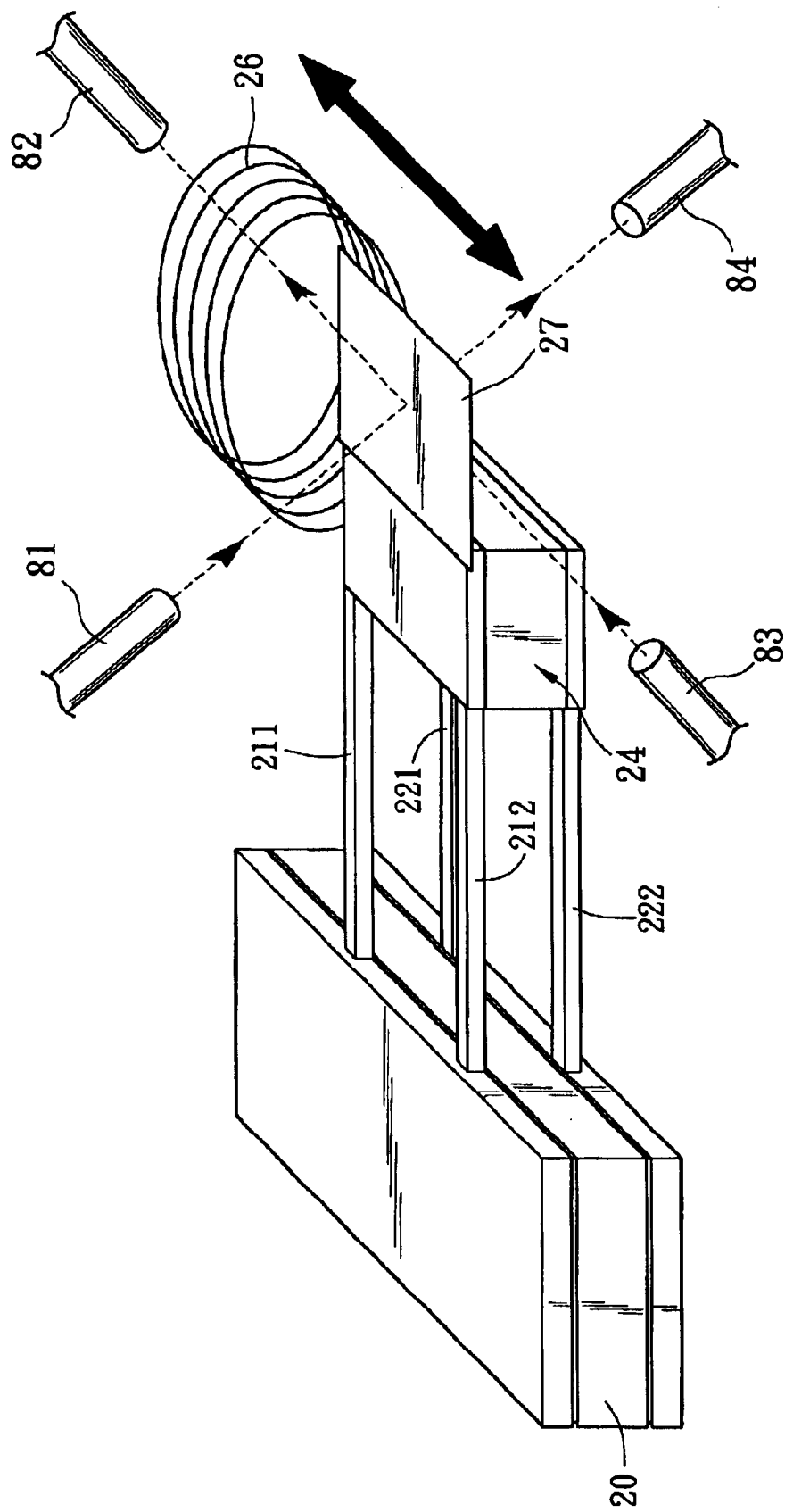

For the embodiment of an optical switch, please refer to FIG. 12A. A silicon crystal mirror is made by wet etching. The differential actuator uses its out-of-plane motions to achieve optical switching. The suspension arms 211, 212, 221, 222 along with the upper and lower layers of the support part 24 are made of nickel (Ni). The central layer of the support part 24 is made of silicon (Si). It is connected with a silicon crystal mirror 27. An external coil 26 produces an electromagnetic force to drive the motion of the support part. The elements 81, 82, 83, and 84 are optical fiber collimators. As shown in FIG. 12B, the silicon crystal mirror is formed from a silicon wafer surface or an SOI wafer. The differential actuator makes in-plane motions to achieve optical switching and is driven by electromagnetic forces. The support part 24 makes in-plane horizontal motions (FIG. 12B) or out-of-plane vertical motions (FIG. 12A). The differential structure design of the suspension arms 211, 212, 221, 222 can absorb the deformation due to rotated tilt angle, providing the support part 24 with parallel in-plane or out-of-plane horizontal and vertical motions.

On the other hand, one can use the Joule thermal force to make the deformation of the first suspension arm 211 and the second suspension arm 212 greater (or smaller) than that of the first suspension arm 221 and the second suspension arm 222 to make out-of-plane vertical motions. Alternatively, one can make the deformation of the first suspension arms 211, 221 greater (or smaller) than that of the second suspension arms 212, 222 to make in-plane horizontal motions. Of course, one can also implement the invention using electrostatic forces, electromagnetic actuation, and piezoelectric forces.

EFFECTS OF THE INVENTION

The invention is a micro electromechanical differential actuator that utilizes a support structure with a suspension arm set to achieve the following effects:

1. Since the vertical and horizontal suspension arm structure uses a differential symmetric structure, it can make motions in the vertical and horizontal degrees of freedom without tilting. It is very little support base deformation, resulting in parallel plane contacts. There is, therefore, no stability problem. If the support base is a mirror design, then the optical loss can be greatly reduced.

2. The disclosed micro electromechanical differential actuator can improve such devices as optical switches, variable optical attenuators, optical tunable filters, modulators, tunable VCSEL's, grating modulators, micro displays, and RF switches by solving the problem of large optical loss in the prior art.

3. The micro electromechanical differential actuator of the invention discloses a new structure for optical switches. A silicon crystal wafer is used as the micro mirror material in the embodiments.

4. The disclosed micro electromechanical differential actuator shows a new structure of array differential actuator with two degrees of freedom. It can modulate the diffraction order efficiency through out-of-plane motions and modulate the diffraction light phase-shifting through in-plane motions.

What is claimed is:

1. A micro electromechanical differential actuator for driving and making out-of plane vertical motions and/or in-plane horizontal motions, which comprises:

a fixed base;

a first structure layer connected to one side of the fixed base and extends out at least on suspension arm from one of its sides;

a second structure layer connected to the other side or the same side of the fixed base and extends a corresponding suspension arm for each of the suspension arm on the first structure layer; and a support part connected to the suspension arms of the first structure layer and the second structure layer;

wherein the support part is driven by a driving force from the actuator to make out-of-plane vertical motion and in-plane horizontal motions, and the suspension arms of the first structure layer and the second structure layer absorbs motion deformation of the support part so that it is maintained level and;

wherein the support part is further connected with the suspension arm structure to form a double-sided bridge structure.

2. The micro electromechanical differential actuator of claim 1, wherein the driving means of the actuator is selected from the group consisting of an electrostatic force, a Joule thermal force, an electromagnetic actuation, and a piezoelectric force.

3. The micro electromechanical differential actuator of claim 2 further comprising a coil and a magnetic conductive material in the support part, wherein the coil is supplied with an electric current to drive the support part into motion.

4. The micro electromechanical differential actuator of claim 2, wherein the actuator is supplied with an electric current to generate deformation on the suspension arms of the first structure layer and the second structure layer, thereby bringing the support part into motion.

5. The micro electromechanical differential actuator of claim 4, wherein the support part makes out-of-plane motions in response to the difference in the deformation amounts of the suspension arms on the upper and lower sides of the first structure layer and the second structure layer.

6. The micro electromechanical differential actuator of claim 4, wherein the support part makes in-plane motions in response to the difference in the deformation amounts of the suspension arms on the left and right sides of the first structure layer and the second structure layer.

7. The micro electromechanical differential actuator of claim 1, wherein the suspension arms on each of the first structure layer and the second structure layer form a pair of suspension arms.

8. The micro electromechanical differential actuator of claim 7, wherein the two pairs of suspension arms are connected to symmetric parts of the support part.

9. The micro electromechanical differential actuator of claim 1, wherein the actuator is expanded to an arrayed structure.

10. The micro electromechanical differential actuator of claim 1 applied to a device selected from the group consisting of an optical switch, a variable optical attenuator, an optical tunable filter, a modulator, a tunable VCSEL, a grating modulator, a micro display, and an RF switch.

11. The micro electromechanical differential actuator of claim 10, wherein the support part is combined with a mirror and applied to an optical switch to selectively reflect/pass a light beam.

* * * * *